(12) United States Patent
Sherman

(10) Patent No.: US 9,231,123 B1
(45) Date of Patent: Jan. 5, 2016

(54) FLEXIBLE CONNECTORS FOR BUILDING INTEGRABLE PHOTOVOLTAIC MODULES

(75) Inventor: Adam C. Sherman, Newark, CA (US)

(73) Assignee: Apollo Precision (Fujian) Limited, Quanzhou, Fujian Province (CN)

( * ) Notice: Subject to any disclaimer, the term of this patent is extended or adjusted under 35 U.S.C. 154(b) by 845 days.

(21) Appl. No.: 13/043,227

(22) Filed: Mar. 8, 2011

(51) Int. Cl.
| | |
|---|---|
| *H01L 31/00* | (2006.01) |
| *H01L 31/02* | (2006.01) |
| *H02S 40/36* | (2014.01) |
| *H01L 31/048* | (2014.01) |
| *H01L 31/05* | (2014.01) |
| *H02S 40/30* | (2014.01) |
| *H02S 40/34* | (2014.01) |

(52) U.S. Cl.
CPC .... *H01L 31/02002* (2013.01); *H01L 31/02013* (2013.01); *H01L 31/0485* (2013.01); *H02S 40/36* (2014.12); *H01L 31/02* (2013.01); *H01L 31/048* (2013.01); *H01L 31/05* (2013.01); *H02S 40/30* (2014.12); *H02S 40/34* (2014.12); *Y02E 10/50* (2013.01)

(58) Field of Classification Search
CPC .................. H01L 31/02002; H01L 31/02013; H01L 31/02; H01L 31/048; H01L 31/0485; H02S 40/30; H02S 40/34; H02S 40/36; Y02E 10/50
USPC .............. 136/243–251; 52/173.3; 29/890.033
See application file for complete search history.

(56) References Cited

U.S. PATENT DOCUMENTS

| | | |
|---|---|---|
| 3,291,636 A | 12/1966 | Reighter et al. |
| 3,325,769 A | 6/1967 | Travis |
| 3,838,234 A | 9/1974 | Peterson |
| 4,754,285 A | 6/1988 | Robitaille |

(Continued)

FOREIGN PATENT DOCUMENTS

| | | |
|---|---|---|
| EP | 2429002 | 3/2012 |
| WO | 2009/137347 | 11/2009 |

(Continued)

OTHER PUBLICATIONS

U.S. Appl. No. 13/046,453, filed Mar. 11, 2011, entitled "Separable Flexible Photovoltaic Connector" by Adam C. Sherman et al.

(Continued)

*Primary Examiner* — Matthew Martin
(74) *Attorney, Agent, or Firm* — Weaver Austin Villeneuve & Sampson LLP

(57) ABSTRACT

Provided are novel building integrable photovoltaic (BIP) modules having flexible connectors and methods of fabricating thereof. According to various embodiments, a BIP module includes a photovoltaic insert having one or more photovoltaic cells and a flexible connector having a flexible member and a connector member. The flexible member provides flexible mechanical support to the connector member with respect to the insert. The flexible member may include a flat conductive strip, a portion of which is shaped to provide additional flexibility to the flexible member along its width. The connector member encloses one or more conductive elements, such as louvered sockets, which are electrically connected to the photovoltaic insert by the flexible member. In certain embodiments, the same flat conductive strip is used to form a shaped portion as well as conductive element and/or a portion of a bus bar extending into the photovoltaic insert.

21 Claims, 11 Drawing Sheets

(56) References Cited

U.S. PATENT DOCUMENTS

| | | | |
|---|---|---|---|
| 4,847,818 | A | 7/1989 | Olsen |
| 5,059,254 | A | 10/1991 | Yaba et al. |
| 5,179,733 | A | 1/1993 | Matsui |
| 5,209,987 | A | 5/1993 | Penneck |
| 5,218,577 | A | 6/1993 | Seager |
| 5,232,518 | A | 8/1993 | Nath et al. |
| 5,391,235 | A | 2/1995 | Inoue |
| 5,526,006 | A | 6/1996 | Akahane et al. |
| 6,111,189 | A | 8/2000 | Garvison et al. |
| 6,456,724 | B1 | 9/2002 | Watanabe |
| 6,576,830 | B2 | 6/2003 | Nagao et al. |
| 6,707,689 | B2 | 3/2004 | Momota et al. |
| 6,840,799 | B2 | 1/2005 | Yoshikawa et al. |
| 6,967,278 | B2 | 11/2005 | Hatsukaiwa et al. |
| 7,056,145 | B2 * | 6/2006 | Campbell et al. ............. 439/373 |
| 7,138,578 | B2 | 11/2006 | Komamine |
| 7,297,867 | B2 | 11/2007 | Nomura et al. |
| 7,708,578 | B1 | 5/2010 | Lenox |
| 7,726,301 | B2 | 6/2010 | Shin et al. |
| 7,762,832 | B2 | 7/2010 | Minnick |
| 7,789,700 | B2 | 9/2010 | Wang et al. |
| 7,824,191 | B1 | 11/2010 | Browder |
| 7,854,095 | B2 | 12/2010 | Banister |
| 7,963,802 | B2 | 6/2011 | Corneille et al. |
| 7,987,641 | B2 | 8/2011 | Cinnamon |
| 8,147,274 | B2 | 4/2012 | Mizukami |
| 8,192,207 | B2 | 6/2012 | Iida |
| 8,286,393 | B2 | 10/2012 | Reyal et al. |
| 8,333,040 | B2 | 12/2012 | Shiao et al. |
| 8,414,308 | B1 | 4/2013 | Meyers |
| 8,613,169 | B2 | 12/2013 | Sherman et al. |
| 2003/0098059 | A1 | 5/2003 | Hanoka |
| 2003/0227663 | A1 | 12/2003 | Agrawak et al. |
| 2005/0000562 | A1 | 1/2005 | Kataoka et al. |
| 2006/0054213 | A1 * | 3/2006 | Baret ........................... 136/251 |
| 2008/0053511 | A1 | 3/2008 | Nakamura |
| 2008/0149170 | A1 | 6/2008 | Hanoka |
| 2008/0196756 | A1 | 8/2008 | Basol |
| 2008/0289681 | A1 | 11/2008 | Adriani et al. |
| 2008/0314432 | A1 * | 12/2008 | Paulson et al. ................ 136/244 |
| 2009/0084432 | A1 | 4/2009 | Kosmehl |
| 2009/0126782 | A1 | 5/2009 | Krause et al. |
| 2009/0145746 | A1 * | 6/2009 | Hollars ................... 204/192.25 |
| 2010/0326498 | A1 | 12/2010 | Corneille et al. |
| 2011/0139288 | A1 | 6/2011 | Rushlander et al. |
| 2011/0183540 | A1 | 7/2011 | Keenihan et al. |
| 2011/0277811 | A1 | 11/2011 | Corneille et al. |
| 2013/0118558 | A1 | 5/2013 | Sherman |

FOREIGN PATENT DOCUMENTS

| | | |
|---|---|---|
| WO | 2009/137348 | 11/2009 |
| WO | 2009/137351 | 11/2009 |
| WO | 2009/137352 | 11/2009 |
| WO | 2009/137353 | 11/2009 |

OTHER PUBLICATIONS

U.S. Appl. No. 13/046,461, filed Mar. 11, 2011, entitled "Electrical Connectors of Building Integrable Photovoltaic Modules" by Jason S. Corneille et al.

U.S. Appl. No. 13/042,320, filed Mar. 7, 2011, entitled "Sliding Electrical Connectors for Building Integrable Photovoltaic Modules" by Michael C. Meyers.

U.S. Appl. No. 13/046,453, Office Action mailed Jan. 9, 2012.

U.S. Appl. No. 13/046,453, Final Office Action mailed May 18, 2012.

U.S. Appl. No. 13/042,320, Office Action mailed Jul. 26, 2012.

U.S. Appl. No. 13/042,317, Notice of Allowance mailed Dec. 7, 2012.

U.S. Appl. No. 13/046,461, Office Action mailed Apr. 9, 2013.

U.S. Appl. No. 13/046,461, Final Office Action mailed Oct. 8, 2013.

U.S. Appl. No. 13/298,178, Office Action mailed May 23, 2014.

U.S. Appl. No. 13/046,461, Office Action mailed Sep. 3, 2014.

U.S. Appl. No. 13/046,461, Notice of Allowance mailed Apr. 13, 2015.

U.S. Appl. No. 13/298,178, Office Action mailed Feb. 20, 2015.

* cited by examiner

FLEXIBLE CONNECTORS FOR BUILDING INTEGRABLE PHOTOVOLTAIC MODULES

BACKGROUND

Photovoltaic cells are widely used for electricity generation with one or more photovoltaic cells typically sealed within and interconnected in a module. Multiple modules may be arranged into photovoltaic arrays used to convert solar energy into electricity by the photovoltaic effect. Arrays can be installed on building rooftops and are used to provide electricity to the buildings and to the general grid.

SUMMARY

Provided are novel building integrable photovoltaic (BIP) modules having flexible connectors and methods of fabricating thereof. According to various embodiments, a BIP module includes a photovoltaic insert having one or more photovoltaic cells and a flexible connector having a flexible member and a connector member. The flexible member provides flexible mechanical support to the connector member with respect to the insert. The flexible member may include a flat conductive strip, a portion of which is shaped to provide additional flexibility to the flexible member along its width. The connector member encloses one or more conductive elements, such as louvered sockets, which are electrically connected to the photovoltaic insert by the flexible member. In certain embodiments, the same flat conductive strip is used to form a shaped portion as well as conductive element and/or a portion of a bus bar extending into the photovoltaic insert.

In certain embodiments, a BIP module includes a photovoltaic insert having one or more electrically interconnected photovoltaic cells and a connector having a flexible member and a connector member. The connector member includes a conductive element for establishing an electrical connection to another conductive element of an adjacent BIP module during installation. The flexible member provides flexible mechanical support to the connector member with respect to the insert. Furthermore, the flexible member provides an electrical connection between the conductive element of the connector member and the photovoltaic insert. The flexible member may include a flat conductive strip having a shaped portion, e.g., a sinusoidally shaped portion, extending between the insert and the connector member. This shaped portion provides additional flexibility to the flexible member and allows the connector member to move more freely in one or more directions with respect to the insert, for example, along a direction parallel to the strip's width within a range that is greater than that width.

In certain embodiments, a connector member includes a cavity having an inner surface. The conductive element covers at least a portion of this inner surface. The conductive element may include one or more spring-like contact features, such as louvered contact features, extending inwards into that cavity. In specific embodiments, a conductive element is formed from the same flat conductive strip as the shaped portion without a need to form a separate connection between the conductive element and the shaped portion. In other embodiments, the shaped portion is a separate element from the conductive strip, and the two may be connected using, for example, resistance welding, ultrasonic welding, laser welding, soldering, and many other connection techniques. A flat conductive strip may extend into a photovoltaic insert and make a direct mechanical and electrical connection to one of the photovoltaic cells and/or internal bus bars of the insert. In other embodiments, a flat conductive strip is connected to a portion of a bus bar that extends outside of the insert. Connections between a flat conductive strip and a bus bar and between a flat conductive strip and a conductive element may be enclosed into a rigid or a semi-rigid enclosure to prevent these connections from breaking when the flexible connector is bent. In other words, flexibility of these connections is restricted in order to preserve their integrity.

In certain embodiments, each photovoltaic cell includes a conductive support substrate and/or a conductive top surface current collector. The conductive support substrate may be made from a stainless steel foil. The current collector may include a conductive wire network. A flat conductive strip may be welded directly to the conductive support substrate and/or current collector of one of the photovoltaic cells in the insert without a need for intermediate wires, such as bus bars. In other embodiments, a flat conductive strip is welded to a bus bar within the insert or extending outside of the insert.

In certain embodiments, a flat conductive strip has a ratio of its width to its thickness of at least about 10 or of at least about 30, or even at least about 40. A flat conductive strip may be between about 3 millimeters and 18 millimeters wide or, more specifically, between about 6 millimeters and 12 millimeters wide. In the same or other embodiments, a flat conductive strip may be between about 0.1 millimeters and 0.6 millimeters thick or, more particularly, between about 0.2 millimeters and 0.4 millimeters thick. A strip may be made from one or more of the following materials: copper, aluminum, nickel, silicon, beryllium, tin, tellurium, silver, phosphorous, cobalt, iron, zinc, chromium, zirconium, magnesium, titanium, and combinations thereof.

In certain embodiments, a shaped portion of the flexible connector is enclosed in and electrically insulated by a flexible polymeric shell. In specific embodiments, this flexible polymeric shell extends over and electrically insulates one or more conductive elements of the connector member. The flexible polymeric shell may be in direct contact with one or more conductive elements and at least partially enclosing the conductive elements without any intermediate components in between the shell and conductive elements. In other embodiments, the conductive elements may be enclosed within an intermediate body, e.g., an insulating housing made from a rigid plastic material, which in turn is at least partially covered or enclosed with the flexible polymeric shell. Some examples of rigid materials include polyethylene terephthalate (e.g., RYNITE® available from Du Pont in Wilmington, Del.), polybutylene terephthalate (e.g., CRASTIN® also available from Du Pont), nylon in any of its engineered formulations of Nylon 6 and Nylon 66, polyphenylene sulfide (e.g., RYTON® available from Chevron Phillips in The Woodlands, Tex.), polyamide (e.g., ZYTEL® available from DuPont), polycarbonate (PC), polyester (PE), polypropylene (PP), and polyvinyl chloride (PVC) and weather able engineering thermoplastics such as polyphenylene oxide (PPO), polymethyl methacrylate, polyphenylene (PPE), styrene-acrylonitrile (SAN), polystyrene and blends based on those materials. Furthermore, weatherable thermosetting polymers, such as unsaturated polyester (UP) and epoxy, may be used.

A flexible polymeric shell include may be made from various flexible materials. Some examples include polyethylene, polypropylene, thermoplastic olefins, thermoplastic rubber, thermoplastic elastomer, ethylene propylene diene, monomer (EPDM), fluoroelastomers or thermoplastic vulcanizates (TPV), and flexible cast thermoset materials, such as urethanes or silicones. In general, various flexible thermoplastic elastomers that have suitable thermally durable behavior may be used. Some specific examples include SANTOPRENE®

(Supplied by Exxon Mobil in Houston, Tex.), HIPEX® (Supplied by Sivaco in Santa Clara, Calif.), EFLEX® (Supplied by E-Polymers Co., Ltd. In Seoul, Korea), ENFLEX® (Supplied by Enplast Limited in Longford, Ireland), EXCELINK® (Supplied by JSR Corporation in Tokyo, Japan), SYNOPRENE® (Supplied by Synoprene Polymers Pvt. Ltd. in Mumbai, India), ELASTRON®) (Supplied by Elastron Kimya in Kocaeli, Turkey). Furthermore, nitrile butadiene rubber (e.g., KRYNAC® (available from Lanxess in Maharashtra, India), NIPOL® (available from Zeon Chemicals in Louisville, Ky.) or NYSYN® (available from Copolymer Rubber & Chemicals in Batton Rouge, La.)), hydrogenated nitrile butadiene rubber (e.g., THERBAN® (available from Lanxess in Maharashtra, India), ZETPOL® (available from Zeon Chemicals in Louisville, Ky.)), and tetra-fluoro-ethylene-propylene (e.g., AFLAS® (Asahi Glass in Tokyo, Japan) and DYNEON BRF® (available from 3M in St. Paul, Minn.) and VITON VTR® (available from DuPont Performance Polymers in Wilmington, Del.)) may be used as well.

Both rigid and flexible materials described above and elsewhere in this document may include engineered polymers, which are specifically formulated to meet certain requirements specific for photovoltaic applications. For example, certain hybrid block co-polymers may be used.

The properties of rigid and/or flexible materials listed above may be enhanced with the addition of fire retardants, color pigments, anti-tracking, and/or ignition resistant materials. In addition, glass or mineral fibers powders and/or spheres may be used to enhance the structural integrity, surface properties, and/or weight reduction. The materials may also include additives such as anti-oxidants, moisture scavengers, blowing or foaming agents, mold release additives, or other plastic additives.

In certain embodiments, a BIP module includes a connector member has two conductive elements, i.e., a first conductive element and a second conductive element. In these embodiments, the flexible member also includes a second flat conductive strip having a second shaped portion extending between the insert and the connector member. The second strip is electrically insulated from the first strip and provides an electrical connection between the second conductive element and photovoltaic cells or some other bus bar. The second flat conductive strip typically extends parallel to the first flat conductive strip at least between the insert and the connector member. The second strip may be positioned over the first flat conductive strip or next to the first conductive strip, relative to their widths. In certain embodiments, one or more flat conductive strips of the flexible connector extend in a direction substantially parallel to a short edge of the photovoltaic insert. One or more portions of the flexible member may be not movable with respect to the insert or with respect to the connector member to protect connections made in these areas.

These and other aspects of the invention are described further below with reference to the figures.

DETAILED DESCRIPTION OF EXAMPLE EMBODIMENTS

Figure 1:
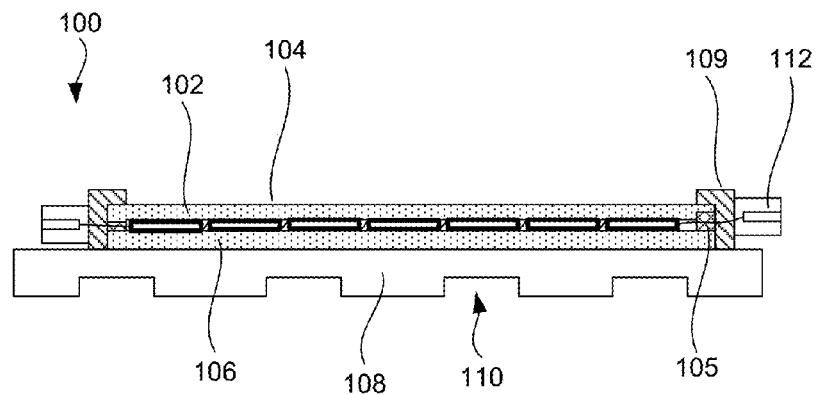
FIG. 1 is a schematic cross-sectional side view of a building integrable photovoltaic (BIP) module in accordance with certain embodiments.

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

Introduction

Building-integrable photovoltaic (BIP) modules are defined as specially configured photovoltaic modules that are used for integration into building structures in various parts of buildings, such as rooftops, skylights, or facades. In certain examples, BIP modules replace conventional building materials, such as asphalt shingles. Unlike traditional photovoltaic systems, BIP modules often do not require separate mounting hardware. As such, installed BIP modules provide substantial savings over more traditional systems in terms of building materials and labor costs. For example, a substantial part of traditional asphalt roof shingles may be replaced by "photovoltaic shingles." In certain embodiments, photovoltaic shingles are installed on the same base roof structures as the asphalt shingles. In fact, a rooftop may be covered by a combination of the asphalt and photovoltaic shingles. In certain embodiments, BIP modules are shaped like one or a collection of asphalt shingles. BIP modules may look and act much like the asphalt shingles while producing electricity in addition to protecting the underlying building structures from the environment. In certain embodiments, BIP modules may be about 14 (e.g., 13.25) inches by about 40 (e.g., 39.375) inches in size and may be stapled directly to the roof deck through water barrier roofing cloth, for example. Generally, only a portion of the photovoltaic shingle is exposed, while the remaining portion is covered by other shingles. The exposed portion is referred to as the "shingle exposure", while the covered portion is referred to as the "flap." For example, the shingle exposure of a 13.25 inch by 39.375 inch shingle may be only about 5 inches wide or, in some embodiments, about 5.625 inches wide. The length of the shingle exposure in some of these embodiments may be 36 inches or about 39.375 inches (if side skirts are not used, for example). Other dimensions of photovoltaic shingles may be used as well.

Various challenges are presented by establishing electrical connections between multiple BIP modules that form a photovoltaic array. Many electrical connections need to be made between these BIP modules and other components of the array while maintaining mechanical and environmental integrity of the underlying building structure, e.g., a rooftop. In some embodiments, the electrical connections are made on the external side of the building structure, to avoid making holes in the building structure that internal connections may need. At the same time, electrical connections made between BIP modules on the external side of the structure should not interfere with performance (e.g., by blocking sun exposure of the front surfaces of the BIP modules or by occupying substantial areas that could be otherwise used to position photovoltaic modules) and general appearance of the array. Furthermore, BIP modules often operate at high electrical currents due to voltage restrictions in many applications and large power loads that can be generated by large arrays. In certain embodiments, a set of modules interconnected in series is configured for delivering an electrical current of up to about 30 A or, more particularly, up to about 20 A. As such, in certain embodiments, the connectors have conductive components with sufficiently large cross-sectional profiles. Being relatively thin structures, BIP modules may include thin electrical bus bars that are made sufficiently wide for conductivity reasons. For example, bus bars often have a width-to-thickness ratio of at least about 10 and even at least about 30. In a particular example, a bus bar is about 0.2 millimeters thick and about 0.8 millimeters wide. In more general examples, a bus bar has a cross-sectional area of at least about 0.5 millimeters-square or, more particularly, at least about 1.0 millimeter-square, or about 1.5 millimeters-square.

In certain embodiments, flexible connectors described herein are configured to connect to such bus bars. The bus bar characteristics present some constraints in conductive components for module connectors. For example, while stranded wires are typically used for flexible connections, solder connections or adapter connections used to stranded wire to bus bar connections tend to be bulky. Furthermore, stranded wires are generally much thicker that bus bars of the same conductivity and may not be used in certain applications.

According to various embodiments, the flexible connectors include flat conductive strips as conductive elements. The flat strips are easily connectable to bus bars of photovoltaic inserts, as well as to other current carrying components of BIP modules, such as conductive elements, photovoltaic cell substrates, and current collector networks positioned over the photovoltaic cells. Various interconnection techniques are used depending on the implementation, including resistance welding, ultrasonic welding, laser welding and soldering. Furthermore, in certain embodiments portions of flat conductive strips are formed into conductive elements (e.g., sockets) and/or bus bars partially or fully replacing bus bars of the insert. This latter approach eliminates a need for some of these connections depending on the implementation.

A large width-to-thickness ratio may somewhat limit a flat strip's ability to bend in the direction of the width. A connector may have two or more conductive elements that require two or more flat conductive strips. Such strips may be positioned as two flat strips next to each (with respect to their widths) to prevent thickening of the connector. However, this arrangement further increases a width-to-thickness ratio of the assembly and further limits flexibility of the connector in at least one direction. In certain embodiments, a portion of the flat conductive strip is specifically shaped, e.g., as a sinusoid or, more generally, as a wave, to increase its flexibility in various directions, including in a direction of the strip's width. These and other features are described below in further detail.

To provide a better understanding of various features of BIP modules and methods of integrating connectors with photovoltaic inserts during module fabrication, some examples of BIP modules will now be briefly described. FIG. 1 is a schematic cross-sectional end view (line 1-1 in FIG. 2 indicates the position of this cross-section) of a BIP module 100 in accordance with certain embodiments. BIP module 100 may have one or more photovoltaic cells 102 that are electrically interconnected. Photovoltaic cells 102 may be interconnected in parallel, in series, or in various combinations of these. Examples of photovoltaic cells include copper indium gallium selenide (CIGS) cells, cadmium-telluride (Cd—Te) cells, amorphous silicon (a-Si) cells, micro-crystalline silicon cells, crystalline silicon (c-Si) cells, gallium arsenide multi-junction cells, light adsorbing dye cells, organic polymer cells, and other types of photovoltaic cells.

Photovoltaic cell 102 has a photovoltaic layer that generates a voltage when exposed to sunlight. In certain embodiments, the photovoltaic layer includes a semiconductor junction. The photovoltaic layer may be positioned adjacent to a back conductive layer, which, in certain embodiments, is a thin layer of molybdenum, niobium, copper, and/or silver. Photovoltaic cell 102 may also include a conductive substrate, such as stainless steel foil, titanium foil, copper foil, aluminum foil, or beryllium foil. Another example includes a conductive oxide or metallic deposition over a polymer film, such as polyimide. In certain embodiments, a substrate has a thickness of between about 2 mils and 50 mils (e.g., about 10 mils), with other thicknesses also within the scope. Photovoltaic cell 102 may also include a top conductive layer. This layer typically includes one or more transparent conductive oxides (TCO), such as zinc oxide, aluminum-doped zinc oxide (AZO), indium tin oxide (ITO), and gallium doped zinc oxide. A typical thickness of a top conductive layer is between about 100 nanometers to 1,000 nanometers (e.g., between about 200 nanometers and 800 nanometers), with other thicknesses within the scope.

In certain embodiments, photovoltaic cells 102 are interconnected using one or more current collectors (not shown). The current collector may be attached and configured to collect electrical currents from the top conductive layer. The current collector may also provide electrical connections to adjacent cells as further described with reference to of FIG. 5, below. The current collector includes a conductive component (e.g., an electrical trace or wire) that contacts the top conductive layer (e.g., a TCO layer). The current collector may further include a top carrier film and/or a bottom carrier film, which may be made from transparent insulating materials to prevent electrical shorts with other elements of the cell and/or module. In certain embodiments, a bus bar is attached directly to the substrate of a photovoltaic cell. A bus bar may also be attached directly to the conductive component of the current collector. For example, a set of photovoltaic cells may be electrically interconnected in series with multiple current collectors (or other interconnecting wires). One bus bar may be connected to a substrate of a cell at one end of this set, while another bus bar may be connected to a current collector at another end.

Photovoltaic cells 102 may be electrically and environmentally insulated between a front light-incident sealing sheet 104 and a back sealing sheet 106. Examples of sealing sheets include glass, polyethylene, polyethylene terephthalate (PET), polypropylene, polybutylene, polybutylene terephthalate (PBT), polyphenylene oxide (PPO), polyphenylene sulfide (PPS) polystyrene, polycarbonates (PC), ethylene-vinyl acetate (EVA), fluoropolymers (e.g., polyvinyl fluoride (PVF), polyvinylidene fluoride (PVDF), ethyleneterafluoethylene (ETFE), fluorinated ethylene-propylene (FEP), perfluoroalkoxy (PFA) and polychlorotrifluoroethane (PCTFE)), acrylics (e.g., poly(methyl methacrylate)), silicones (e.g., silicone polyesters), and/or polyvinyl chloride (PVC), as well as multilayer laminates and co-extrusions of these materials. A typical thickness of a sealing sheet is between about 5 mils and 100 mils or, more specifically, between about 10 mils and 50 mils. In certain embodiments, a back sealing sheet includes a metallized layer to improve water permeability characteristics of the sealing sheet. For example, a metal foil may be positioned in between two insulating layers to form a composite back sealing sheet. In certain embodiments, a module has an encapsulant layer positioned between one or both sealing sheets 104, 106 and photovoltaic cells 102. Examples of encapsulant layer materials include non-olefin thermoplastic polymers or thermal polymer olefin (TPO), such as polyethylene (e.g., a linear low density polyethylene, polypropylene, polybutylene, polyethylene terephthalate (PET), polybutylene terephthalate (PBT), polystyrene, polycarbonates, fluoropolymers, acrylics, ionomers, silicones, and combinations thereof.

BIP module 100 may also include an edge seal 105 that surrounds photovoltaic cells 102. Edge seal 105 may be used to secure front sheet 104 to back sheet 106 and/or to prevent moisture from penetrating in between these two sheets. Edge seal 105 may be made from certain organic or inorganic materials that have low inherent water vapor transmission rates (WVTR), e.g., typically less than 1-2 g/m²/day. In certain embodiments, edge seal 105 is configured to absorb moisture from inside the module in addition to preventing moisture ingression into the module. For example, a butylrubber containing moisture getter or desiccant may be added to edge seal 105. In certain embodiments, a portion of edge seal 105 that contacts electrical components (e.g., bus bars) of BIP module 100 is made from a thermally resistant polymeric material. Various examples of thermally resistant materials and RTI ratings are further described below.

BIP module 100 may also have a support sheet 108 attached to back side sealing sheet 106. The attachment may be provided by a support edge 109, which, in certain embodiments, is a part of support sheet 108. Support sheets may be made, for example, from rigid materials. Some examples of rigid materials include polyethylene terephthalate (e.g., RYNITE® available from Du Pont in Wilmington, Del.), polybutylene terephthalate (e.g., CRASTIN® also available from Du Pont), nylon in any of its engineered formulations of Nylon 6 and Nylon 66, polyphenylene sulfide (e.g., RYTON® available from Chevron Phillips in The Woodlands, Tex.), polyamide (e.g., ZYTEL® available from DuPont), polycarbonate (PC), polyester (PE), polypropylene (PP), and polyvinyl chloride (PVC) and weather able engineering thermoplastics such as polyphenylene oxide (PPO), polymethyl methacrylate, polyphenylene (PPE), styrene-acrylonitrile (SAN), polystyrene and blends based on those materials. Furthermore, weatherable thermosetting polymers, such as unsaturated polyester (UP) and epoxy, may be used. The properties of these materials listed above may be enhanced with the addition of fire retardants, color pigments, anti-tracking, and/or ignition resistant materials. In addition, glass or mineral fibers powders and/or spheres may be used to enhance the structural integrity, surface properties, and/or weight reduction. The materials may also include additives such as anti-oxidants, moisture scavengers, blowing or foaming agents, mold release additives, or other plastic additives.

In certain embodiments, support sheet 108 may be attached to back sheet 106 without a separate support edge or other separate supporting element. For example, support sheet 108 and back sheet 106 may be laminated together or support sheet 108 may be formed (e.g., by injection molding) over back sheet 106. In other embodiments back sealing sheet 106 serves as a support sheet. In this case, the same element used to seal photovoltaic cells 102 may be positioned over and contact a roof structure (not shown). Support sheet 108 may have one or more ventilation channels 110 to allow for air to flow between BIP module 100 and a building surface, e.g., a roof-deck or a water resistant underlayment/membrane on top of the roof deck. Ventilation channels 110 may be used for cooling BIP module during its operation. For example, it has been found that each 1° C. of heating from an optimal operating temperature of a typical CIGS cell causes the efficiency loss of about 0.33% to 0.5%.

BIP module 100 has one or more electrical connectors 112 for electrically connecting BIP module 100 to other BIP modules and array components, such as an inverter and/or a battery pack. In certain embodiments, BIP module 100 has two electrical connectors 112 positioned on opposite sides (e.g., the short or minor sides of a rectangular module) of BIP module 100, as for example shown in FIGS. 1 and 2, for example. Each one of two electrical connectors 112 has at least one conductive element electrically connected to photovoltaic cells 102. In certain embodiments, electrical connectors 112 have additional conductive elements, which may or may not be directly connected to photovoltaic cells 102. For example, each of two connectors 112 may have two conductive elements, one of which is electrically connected to photovoltaic cells 102, while the other is electrically connected to a bus bar (not shown) passing through BIP module 100. This and other examples are described in more detail in the context of FIGS. 6 and 7. In general, regardless of the number of connectors 112 attached to BIP module 100, at least two conductive elements of these connectors 112 are electrically connected to photovoltaic cells 102.

Figure 2:
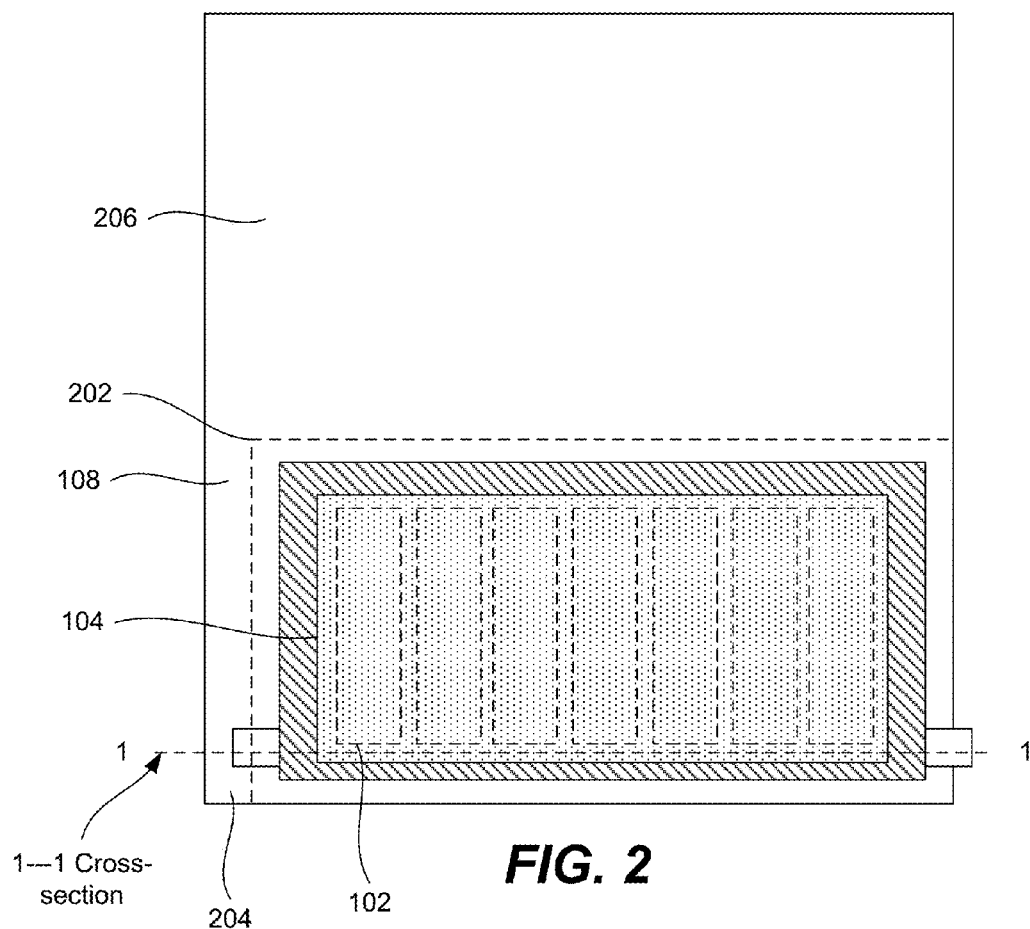
FIG. 2 is a schematic top view of a BIP module in accordance with certain embodiments.

FIG. 2 is a schematic top view of BIP module 100 in accordance with certain embodiments. Support sheet 108 is shown to have a side skirt 204 and a top flap 206 extending beyond a BIP module boundary 202. Side skirt 204 is sometimes referred to as a side flap, while top flap 206 is sometimes referred to as a top lap. In certain embodiments, BIP module 100 does not include side flap 204. BIP module boundary 202 is defined as an area of BIP module 100 that does not extend under other BIP modules or similar building materials (e.g., roofing shingles) after installation. BIP module boundary 202 includes photovoltaic cells 102. Generally, it is desirable to maximize the ratio of the exposed area of photovoltaic cells 102 to BIP module boundary 202 in order to maximize the "working area" of BIP module 100. It should be noted that, after installation, flaps of other BIP modules typically extend under BIP module boundary 202. In a similar manner, after installation, side flap 204 of BIP module 100 may extend underneath another BIP module positioned on the left (in the same row) of BIP module 100 creating an overlap for moisture sealing. Top flap 206 may extend underneath one or more BIP modules positioned above BIP module 100. Arrangements of BIP modules in an array will now be described in more detail with reference to FIGS. 3 and 4.

Figure 3:
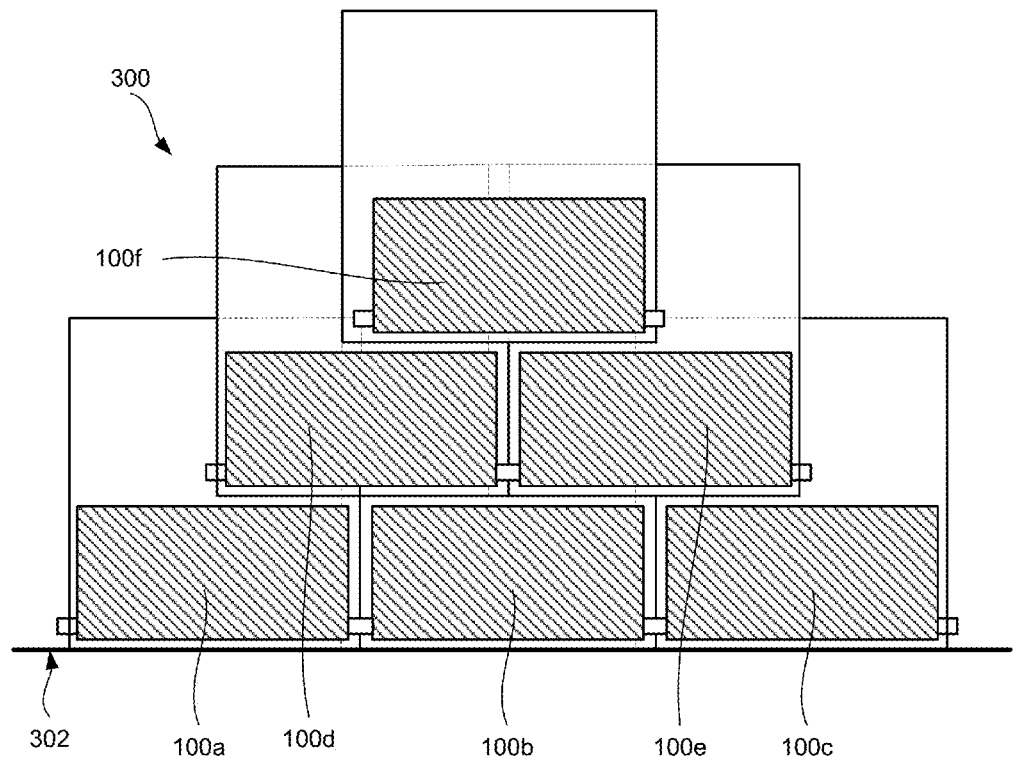
FIG. 3 illustrates a subset of a photovoltaic array that includes six BIP modules in accordance with certain embodiments.

FIG. 3 illustrates a photovoltaic array 300 or, more specifically a portion of a photovoltaic array, which includes six BIP modules 100a-100f arranged in three different rows extending along horizontal rooflines in accordance with certain embodiments. Installation of BIP modules 100a-100f generally starts from a bottom roofline 302 so that the top flaps of BIP modules 100a-100f can be overlapped with another row of BIP modules. If a side flap is used, then the position of the side flap (i.e., a left flap or a right flap) determines which bottom corner should be the starting corner for the installation of the array. For example, if a BIP module has a top flap and a right-side flap, then installation may start from the bottom left corner of the roof or of the photovoltaic array. Another BIP module installed later in the same row and on the right of the initial BIP module will overlap the side flap of the initial BIP module. Furthermore, one or more BIP modules installed in a row above will overlap the top flap of the initial BIP module. This overlap of a BIP module with a flap of another BIP module creates a moisture barrier.

Figure 4:
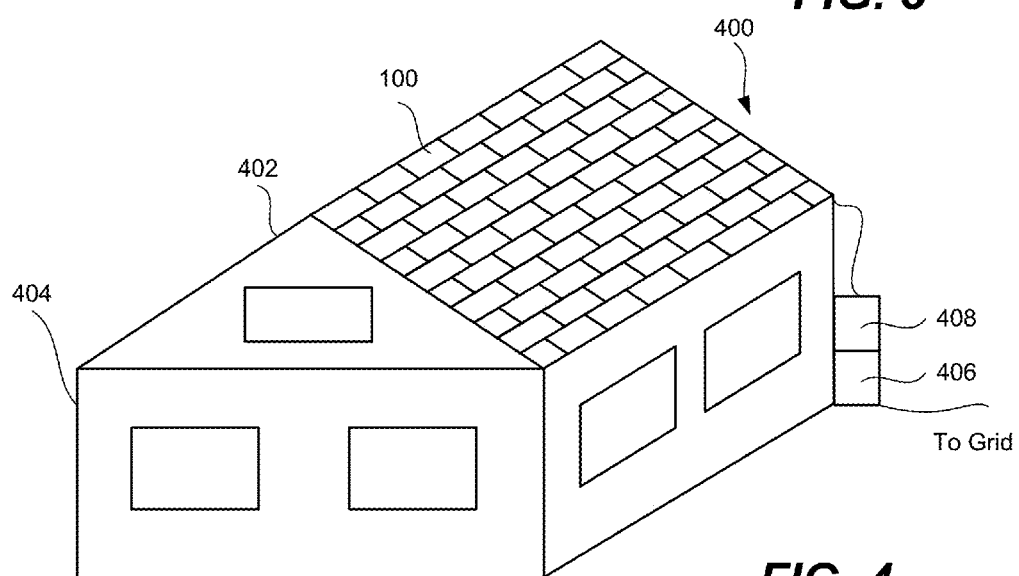
FIG. 4 is a schematic illustration of a photovoltaic array installed on a rooftop of a building structure in accordance with certain embodiments.

FIG. 4 is a schematic illustration of a photovoltaic array 400 installed on a rooftop 402 of a building structure 404 for protecting building structure 404 from the environment as well as producing electricity in accordance with certain embodiments. Multiple BIP modules 100 are shown to fully cover one side of rooftop 402 (e.g., a south side or the side that receives the most sun). In other embodiments, multiple sides of rooftop 402 are used for a photovoltaic array. Furthermore, some portions of rooftop 402 may be covered with conventional roofing materials (e.g., asphalt shingles). As such, BIP modules 100 may also be used in combination with other roofing materials (e.g., asphalt shingles) and cover only a portion of rooftop. Generally, BIP modules 100 may be used on steep sloped to low slope rooftops. For example, the rooftops may have a slope of at least about 2.5-to-12 or, in many embodiments, at least about 3-to-12.

Multiple BIP modules 100 may be interconnected in series and/or in parallel with each other. For example, photovoltaic array 400 may have sets of BIP modules 100 interconnected in series with each other (i.e., electrical connections among multiple photovoltaic modules within one set), while these sets are interconnected in parallel with each other (i.e., electrical connections among multiple sets in one array). Photovoltaic array 400 may be used to supply electricity to building structure 404 and/or to an electrical grid. In certain embodiments, photovoltaic array 400 includes an inverter 406 and/or a battery pack 408. Inverter 406 is used for converting a direct current (DC) generated by BIP modules 100 into an alternating current (AC). Inverter 406 may be also configured to adjust a voltage provided by BIP modules 100 or sets of BIP modules 100 to a level that can be utilized by building structure 404 or by a power grid. In certain embodiments, inverter 406 is rated up to 600 volts DC input or even up to 1000 volts DC, and/or up to 10 kW power. Examples of inverters include a photovoltaic static inverter (e.g., BWT10240-Gridtec 10, available from Trace Technologies in Livermore, Calif.) and a string inverter (e.g. Sunny Boy® 2500 available from SMA America in Grass Valley, Calif.). In certain embodiments, BIP modules may include integrated inverters, i.e., "on module" inverters. These inverters may be used in addition to or instead of external inverter 406. Battery pack 408 is used to balance electric power output and consumption.

Figure 5:
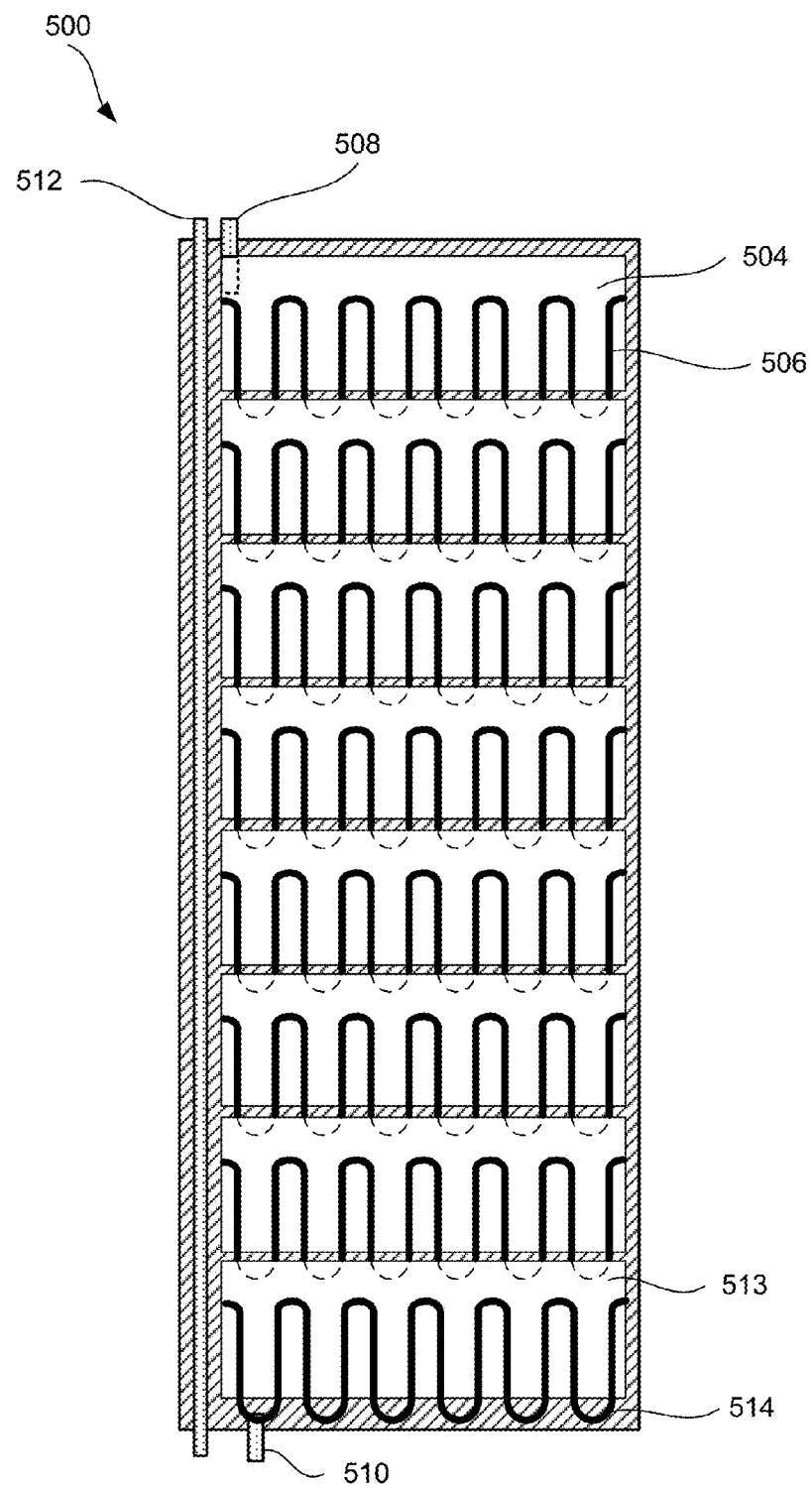
FIG. 5 is a schematic representation of a photovoltaic module having electrically interconnected photovoltaic cells in accordance with certain embodiments.

FIG. 5 is a schematic representation of a photovoltaic module insert 500 illustrating photovoltaic cells 504 electrically interconnected in series using current collectors/interconnecting wires 506 in accordance with certain embodiments. Often individual cells do not provide an adequate output voltage. For example, a typical voltage output of an individual CIGS cell is only between 0.4V and 0.7V. To increase voltage output, photovoltaic cells 504 may be electrically interconnected in series for example, shown in FIG. 5 and/or include "on module" inverters (not shown). Current collectors/interconnecting wires 506 may also be used to provide uniform current distribution and collection from one or both contact layers.

As shown in FIG. 5, each pair of photovoltaic cells 504 has one interconnecting wire positioned in between the two cells and extending over a front side of one cell and over a back side of the adjacent cell. For example, a top interconnecting wire 506 in FIG. 5 extends over the front light-incident side of cell 504 and under the back side of the adjacent cell. In the figure, the interconnecting wires 506 also collect current from the TCO layer and provide uniform current distribution, and may be referred to herein as current collectors. In other embodiments, separate components are used to for current collection and cell-cell interconnection. End cell 513 has a current collector 514 that is positioned over the light incident side of cell 513 but does not connect to another cell. Current collector 514 connects cell 513 to a bus bar 510. Another bus bar 508 may be connected directly to the substrate of the cell 504 (i.e., the back side of cell 504). In another embodiment, a bus bar may be welded to a wire or other component underlying the substrate. In the configuration shown in FIG. 5, a voltage between bus bars 508 and 510 equals a sum of all cell voltages in insert 500. Another bus bar 512 passes through insert 500 without making direct electrical connections to any photovoltaic cells 504. This bus bar 512 may be used for electrically interconnecting this insert in series without other inserts as further described below with reference to FIG. 6. Similar current collectors/interconnecting wires may be used to interconnect individual cells or set of cells in parallel (not shown).

Figure 6:
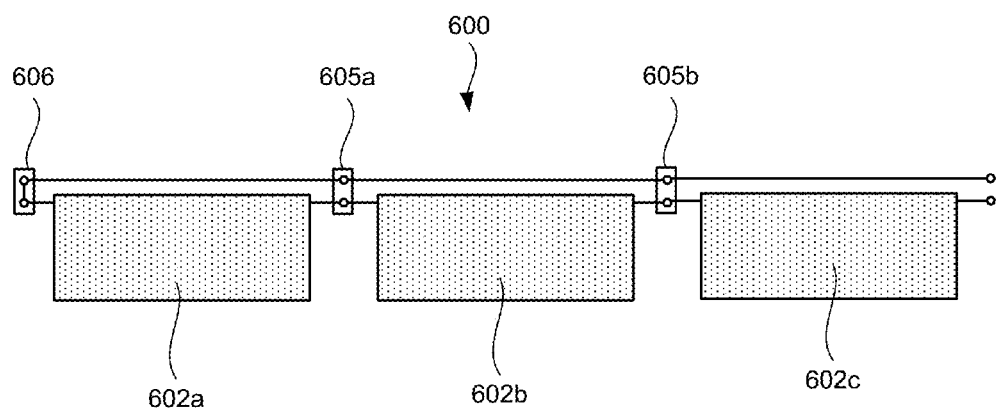
FIG. 6 is a schematic electrical diagram of a photovoltaic array having three BIP modules interconnected in series in accordance with certain embodiments.

BIP modules themselves may be interconnected in series to increase a voltage of a subset of modules or even an entire array. FIG. 6 illustrates a schematic electrical diagram of a photovoltaic array 600 having three BIP modules 602a-602c interconnected in series using module connectors 605a, 605b, and 606 in accordance with certain embodiments. A voltage output of this three-module array 600 is a sum of the voltage outputs of three modules 602a-602c. Each module connector 605a and 605b shown in FIG. 6 may be a combination of two module connectors of BIP modules 602a-602c. These embodiments are further described with reference to FIGS. 8A-8C. In other words, there may be no separate components electrically interconnecting two adjacent BIP modules, with the connection instead established by engaging two connectors installed on the two respective modules. In other embodiments, separate connector components (i.e., not integrated into or installed on BIP modules) may be used for connecting module connectors of two adjacent modules.

Module connector 606 may be a special separate connector component that is connected to one module only. It may be used to electrically interconnect two or more conductive elements of the same module connector.

Figure 7:
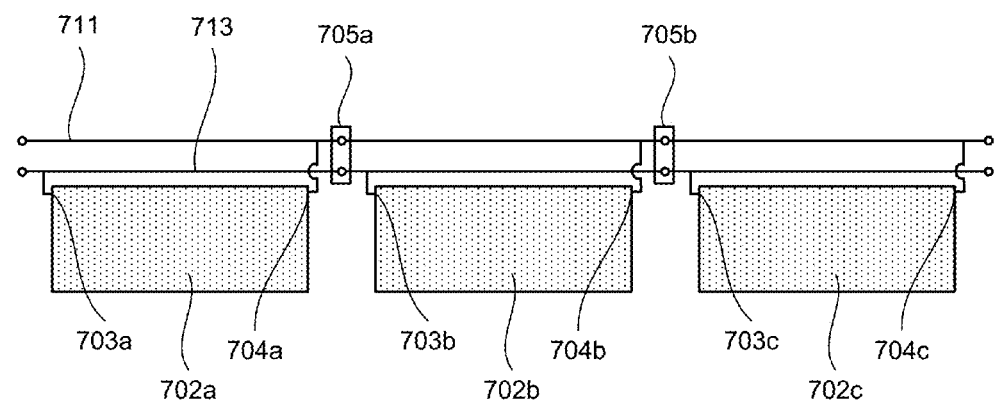
FIG. 7 is a schematic electrical diagram of another photovoltaic array having three BIP modules interconnected in parallel in accordance with other embodiments.

Sometimes BIP modules may need to be electrically interconnected in parallel. FIG. 7 illustrates a schematic electrical diagram of a photovoltaic array 700 having three BIP modules 702a-702c interconnected in parallel using module connectors 705a and 705b in accordance with certain embodiments. Each module may have two bus bars extending through the module, i.e., a "top" bus bar 711 and a "bottom" bus bar 713 as shown in FIG. 7. Top bus bars 711 of each module are connected to right electrical leads 704a, 704b, and 704c of the modules, while bottom bus bars 713 are connected to left electrical leads 703a, 703b, and 703c. A voltage between the top bus bars 711 and bottom bus bars 713 is therefore the same along the entire row of BIP modules 702a-702c.

Figure 8A:
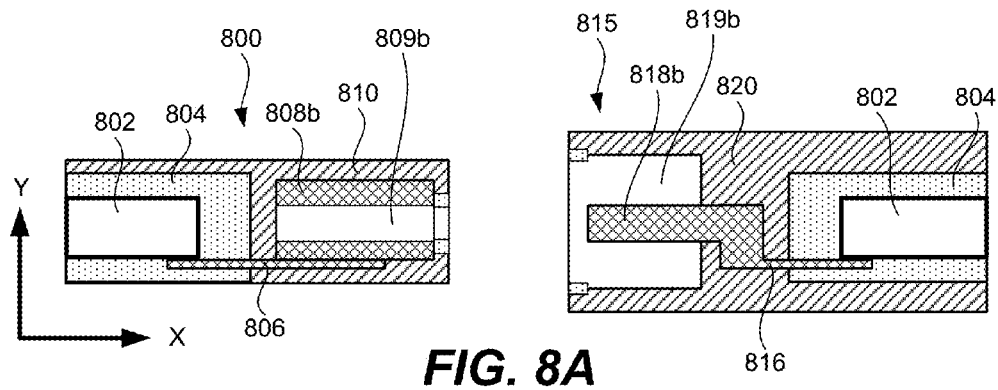
FIGS. 8A-8C are schematic cross-sectional views of two connectors configured for interconnection with each other in accordance with certain embodiments.

FIG. 8A is a schematic cross-sectional side view of two connectors 800 and 815 configured for interconnection with each other, in accordance with certain embodiments. For simplicity, the two connectors are referred to as a female connector 800 and a male connector 815. Each of the two connectors 800 and 815 is shown attached to its own photovoltaic insert, which includes photovoltaic cells 802 and one or more sealing sheets 804. Connectors 800 and 815 include conductive elements 808b and 818b, respectively, which are shown to be electrically connected to photovoltaic cells 802 using bus bars 806 and 816, respectively.

In certain embodiments, a conductive element of one connector (e.g., conductive element 808b of female connector 800) is shaped like a socket/cavity and configured for receiving and tight fitting a corresponding conductive element of another connector (e.g., conductive element 818b of male connector 815). Specifically, conductive element 808b is shown forming a cavity 809b. This tight fitting and contact in turn establishes an electrical connection between the two conductive elements 808b and 818b. Accordingly, conductive element 818b of male connector 815 may be shaped like a pin (e.g., a round pin or a flat rectangular pin). A socket and/or a pin may have protrusions (not shown) extending towards each other (e.g., spring loaded tabs) to further minimize the electrical contact resistance by increasing the overall contact area. In addition, the contacts may be fluted to increase the likelihood of good electrical contact at multiple points (e.g., the flutes guarantee at least as many hot spot asperities of current flow as there are flutes).

Figure 8B:
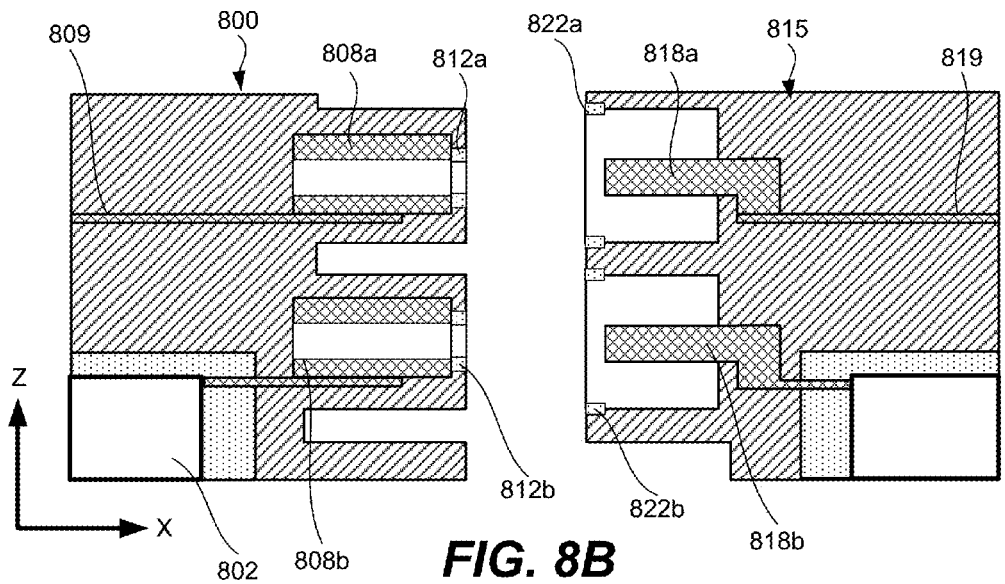
Figure 8C:
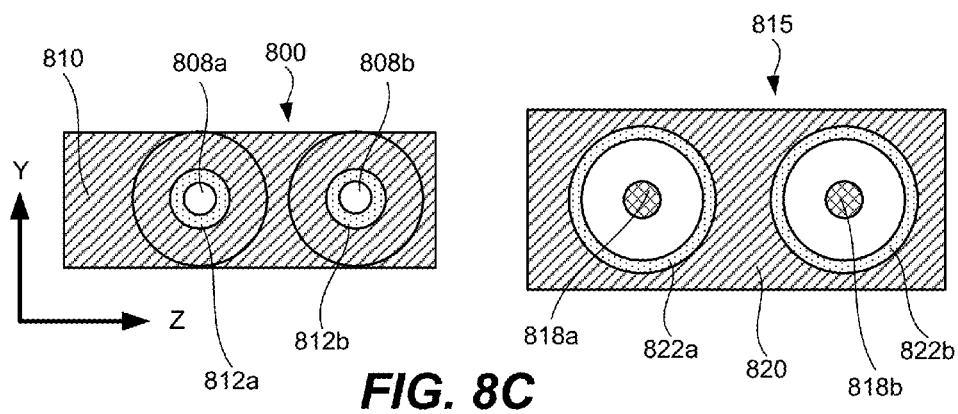

In certain embodiments, connectors do not have a cavity-pin design as shown in FIGS. 8A-8C. Instead, an electrical connection may be established when two substantially flat surfaces contact each other. Conductive elements may be substantially flat or have some topography designed to increase a contact surface over the same projection boundary and/or to increase contact force at least in some areas. Examples of such surface topography features include multiple pin-type or rib-type elevations or recesses.

In certain embodiments, one or more connectors attached to a BIP module have a "touch free" design, which means that an installer can not accidently touch conductive elements or any other electrical elements of these connectors during handling of the BIP module. For example, conductive elements may be positioned inside relatively narrow cavities. The openings of these cavities are too small for a finger to accidently come in to contact with the conductive elements inside the cavities. One such example is shown in FIG. 8A where male connector 815 has a cavity 819b formed by connector body 820 around its conductive pin 818b. While cavity 819b may be sufficiently small to ensure a "touch free" designed as explained above, it is still large enough to accommodate a portion of connector body 810 of female connector 800. In certain embodiments, connector bodies 810 and 820 have interlocking features (not shown) that are configured to keep the two connectors 800 and 815 connected and prevent connector body 810 from sliding outs of cavity 819b. Examples of interlocking features include latches, threads, and various recess-protrusion combinations.

FIG. 8B is schematic plan view of female connector 800 and male connector 815, in accordance with certain embodiments. Each connector 800, 815 is shown with two conductive elements (i.e., conductive sockets 808a and 808b in connector 800 and conductive pins 818a and 818b in connector 815). One conductive element (e.g., socket 808b and pin 818b) of each connector is shown to be electrically connected to photovoltaic cells 802. Another conductive element of each connector 800, 815 may be connected to bus bars (e.g., bus bars 809 and 819) that do not have an immediate electrical connection to photovoltaic cells 802 of their respective BIP module (the extended electrical connection may exist by virtue of a complete electrical circuit).

As shown, sockets 808a and 808b may have their own designated inner seals 812a and 812b. Inner seals 812a and 812b are designed to provide more immediate protection to conductive elements 808a and 818a after connecting the two connectors 800, 815. As such, inner seals 812a and 812b are positioned near inner cavities of sockets 808a and 808b. The profile and dimensions of pins 818a and 818b closely correspond to that of inner seals 812a and 812b. In the same or other embodiments, connectors 800, 815 have external seals 822a and 822b. External seals 822a and 822b may be used in addition to or instead of inner seals 812a and 812b. Various examples of seal materials and fabrication methods are described below in the context of FIG. 9. FIG. 8C is schematic front view of female connector 800 and male connector 815, in accordance with certain embodiments. Connector pins 818a and 818b are shown to have round profiles. However, other profiles (e.g., square, rectangular) may also be used for pins 818a and 818b and conductive element cavities 808a and 808b.

Figure 9:
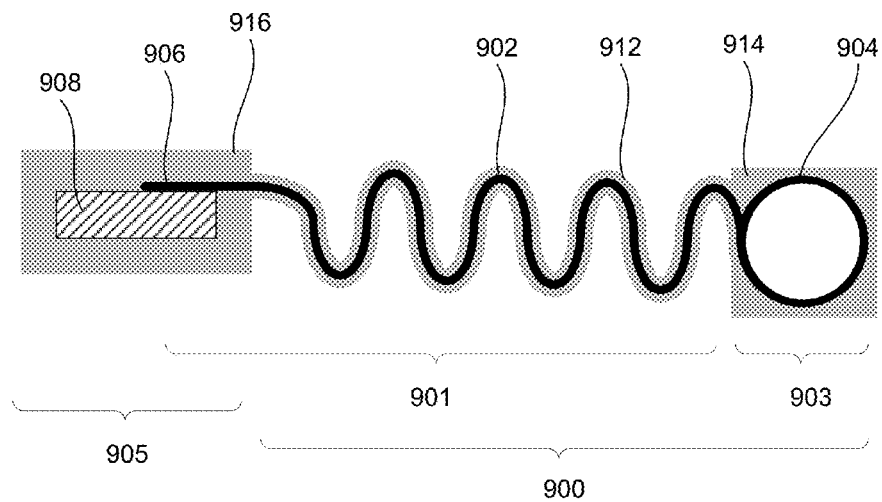
FIG. 9 illustrates one example of a flexible connector, in which the same flat conductive strip is used to form a conductive element, a shaped portion, and a bus wire extending into a photovoltaic insert in accordance with certain embodiments.

FIG. 9 illustrates one example of a flexible connector 900, in which a single flat conductive strip is used to form a conductive element 904, a shaped portion 902, and a bus bar 906 extending into a photovoltaic insert 905 in accordance with certain embodiments. In general, connector 900 may include a flexible member 901 and a connector member 903. Connector 900 is electrically and mechanically connected with insert 905. This interconnection provides a flexible mechanical support to connector member 903 with respect to insert 905. Furthermore, this interconnection allows an electrical current to flow between connector element 904 and photovoltaic cell 908. For brevity, the below description is focused on an electrical connection made to a photovoltaic cell, however, one of ordinary skill in the art would understand that in this and other examples, a connector could also or instead provide an electrical connection to other electrical components of a photovoltaic insert that do not necessarily make an immediate electrical connection to its photovoltaic cells. For example, an insert may include a bus bar that passes from one side of the insert to another and is not directly connected to the cells in this insert.

Returning to FIG. 9, flexible member 901 may include flat conductive strip. In certain embodiments, a flat conductive strip has a ratio of its width to its thickness of at least about 10 or more specifically of at least about 30. The flat conductive strip may be between about 3 millimeters and 18 millimeters wide or, more specifically, between about 6 millimeters and 12 millimeters wide. In the same or other embodiments, a flat conductive strip may be between about 0.1 millimeters and 0.6 millimeters thick or, more particularly, between about 0.2 millimeters and 0.4 millimeters thick. Other dimensions can be used as well. The strip may be made from one or more of the following materials: copper, aluminum, nickel, silicon, beryllium, tin, tellurium, silver, phosphorous, cobalt, iron, zinc, chromium, zirconium, magnesium, titanium, and combinations thereof.

A portion of flexible member 901 includes a shaped portion 902, which may be also referred to as a stress relief portion, and in the depicted in embodiment is a wavy stress relief portion. This portion 902 may be shaped as a sinusoid or have any other suitable shaped profile, such as a series of repeated waves or other bend features. In general, shaped portion 902 should allow connector member 903 to move with respect to insert 905 along any of identified directions over certain predetermined amplitudes.

Shaped portion 902 generally includes one or more movable bends or ribboned features extending perpendicular to the length of flexible member 901. Shaped portion 902 allows the ends of this portion to bend in, at least, a direction parallel to the width of the flat conductive strip used to form flexible member 901. Some flexibility characteristics are further described below in the context of FIG. 12. One having ordinary skills in the art would understand that other factors (e.g., insulation, arrangements of multiple shaped portions in one connector) may also impact flexibility characteristics of the connector. Flexibility characteristics are further described below in the context of FIG. 12. One having ordinary skill in the art would understand that other factors (e.g., insulation, arrangements of multiple shaped portions in one connector) may also impact flexibility characteristics of the connector.

A profile of shaped portion 902 may be characterized based on its overall thickness (i.e., a height of the wave, calculated as a peak-to-peak vertical distance). This cross-sectional profile may be sinusoidal or, more generally, have a curved shape. For example, a flat conductive strip that is about 0.31 inches wide and 0.008 inches thick may be shaped into waves that are 0.10 inches high (between the lowest and highest point in the side profile). A segment that is between about 0.3 inches and 1.0 inches long may have, for example, 5 repeating waves. Other dimensions and shapes could be used as well to provide necessary flexibility between two opposite ends of the shaped portion.

Connector member 903 contains conductive element 904 for establishing an electrical connection to another conductive element of an adjacent BIP module (not shown). Some examples of connector members and conductive elements are further described in the context of FIGS. 8A-8C and FIG. 13. In the example presented in FIG. 9, conductive element 904 is formed from the same flat conductive strip as shaped portion 902 and bus bar 906. For example, a flat metallic strip may be stamped in one or a series of stamping operations to form these three elements of the flexible connector, i.e., conductive element 904, shaped portion 902, and bus bar 906. In this example, there is no need for separate interconnections between shaped portion 902 and conductive element 904 or between shaped portion 902 and bus bar 906.

Conductive components (also referred to as current carrying components or electrical components) are generally electrically insulated. Some examples are described above in the context of FIGS. 8A-8C. As shown in FIG. 9, conductive element 904 has an insulating body 914. Shaped portion 902 has its own insulating sheath 912, while photovoltaic cells 908 and a portion of bus bar 906 are insulated by an insert overmold 916. Since flexibility of connector 900 is provided predominantly by shaped portion 902, its insulating sheath 912 is flexible as well. In certain embodiments, shaped portion 902 is enclosed in and electrically insulated by a thin walled polymeric shell made from flexible materials. Some examples of the flexible materials and corresponding additives are described above. In more specific embodiments, this flexible polymeric shell extends over and provides electrical insulation to conductive element 904. In certain embodiments, insulating body 914 and insulating sheath 912 may be made in one operation and be one integrated structure. In the same or other embodiments, the shell may extend at least over a portion of photovoltaic insert 905. More specifically, insert overmold 916 and insulating sheath 912 may be made in one operation. In even more specific embodiments, insert overmold 916, insulating body 914, and insulating sheath 912 may be made in one operation. One or more of these insulation elements may be formed by injection molding.

Figure 10:
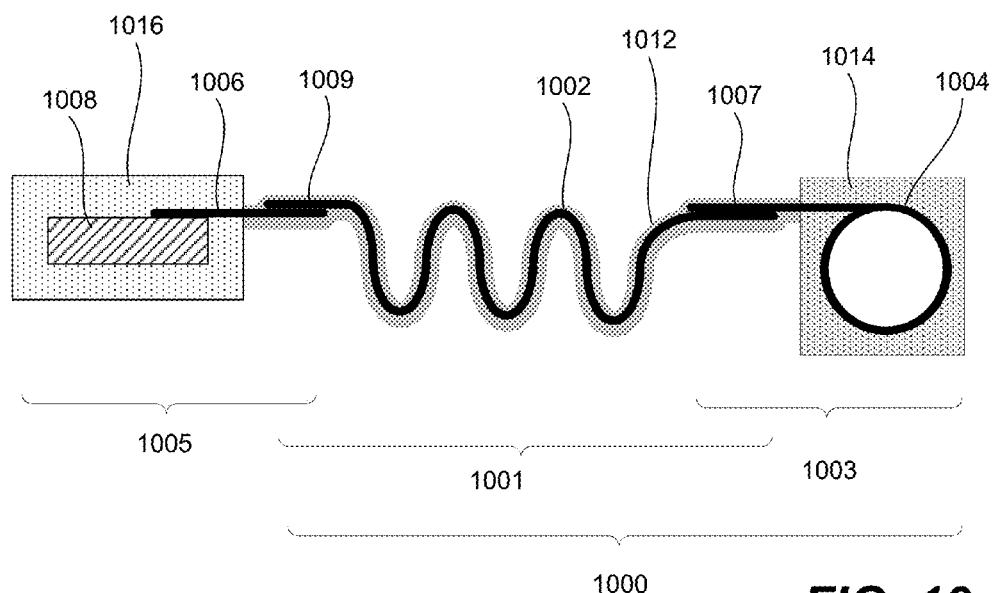
FIG. 10 illustrates another example of a flexible connector, in which a conductive element is attached to a shaped portion that is in turn attached to a bus wire extending from the insert in accordance with certain embodiments.

FIG. 10 illustrates another example of a flexible connector 1000, in which a conductive element 1004 is attached to a shaped portion 1002 that is in turn attached to a bus wire 1006 extending from a photovoltaic insert 1005 in accordance with certain embodiments. Unlike the example presented in FIG. 9, the two electrical elements of connector 1000 (i.e., conductive element 1004 and shaped portion 1002) as well as bus wire 1006 of photovoltaic insert 1005 are all separate physical components that are electrically and mechanically connected to each during fabrication of the BIP module. For example, conductive element 1004 may be attached to shaped portion 1002 using resistance welding, ultrasonic welding, laser welding, soldering, or other appropriate connection technique. Bus wire 1006 may be attached to shaped portion 1002 in a similar manner.

Connector member 1003 may be prefabricated to include conductive elements 1004 inside an insulating housing 1014. A conductive tab electrically connected conductive elements 1004 may extend outside of insulative housing 1014 for making a connection to shaped portion 1002 in a contact area 1007. In a similar manner, photovoltaic insert 1005 may be prefabricated to include one or more electrically interconnected photovoltaic cells 1008 and a bus wire 1006 at least partially enclosed in an overmold 1016. A portion of bus wire 1006 extending outside of overmold 1016 is used for making a connection with shaped portion 1002 in another contact area 1009. In the example shown in FIG. 10 each electrical lead of connector 1000 needs to be connected in two different areas 1007 and 1009. While this design may require additional fabrication operations, it may allow a modular fabrication approach where each component is fabricated independently and allow use of more standardized components.

Shaped portion 1002 may be then insulated together with contact areas 1007 and 1009 and any exposed portions of bus bars 1006 and conductive tabs of connector member 1003. An insulating sheath 1012 may be formed to protect these components and areas. In certain embodiment, photovoltaic insert 1005 does not have overmold 1016 prior to connection to shaped portion 1002. Insulating sheath 1012 may be formed together with overmold 1016. In a similar manner, connector member 1003 may not have insulating housing 1014 prior to connection to shaped portion 1002. Insulating housing 1014 may be formed together with insulating sheath 1012. In more particular embodiments, insulating housing 1014, insulating sheath 1012, and overmold 1016 are made in the same operation forming one integrated body.

Figure 11A:
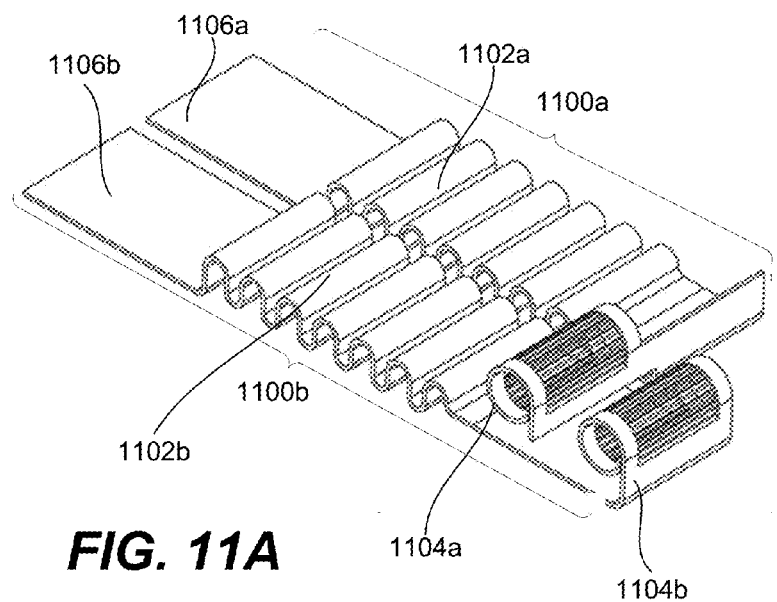
FIG. 11A is a schematic perspective view of two electrical components of the connector arranged with respect to each other prior to forming one or more insulating shells around these components in accordance with certain embodiments.
Figure 11B:
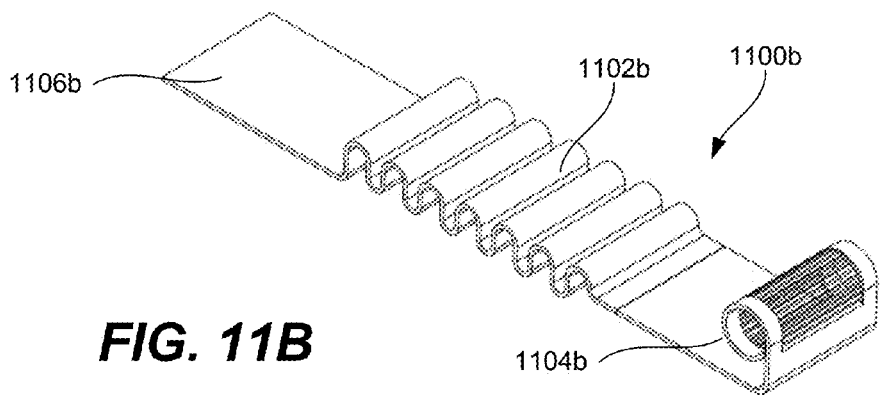
FIGS. 11B and 11C are schematic perspective views of each of the two individual electrical components prior to arranging these components in a subassembly shown in FIG. 11A.
Figure 11C:
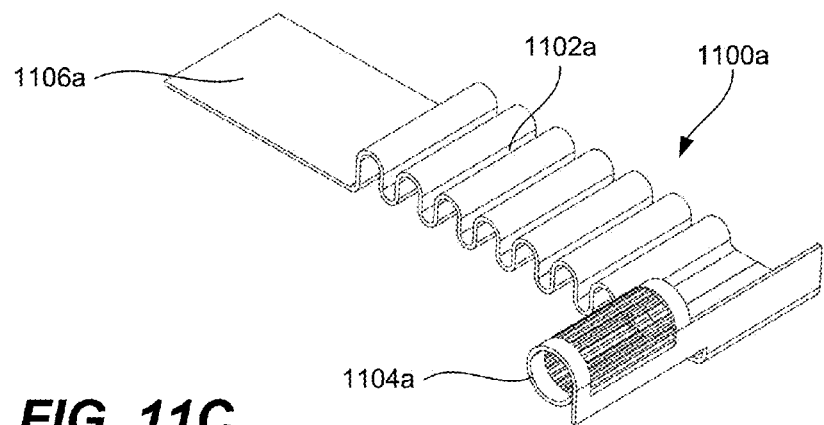

FIG. 11A is a schematic perspective view of two electrical components 1100a and 1100b arranged with respect to each other prior to forming one or more insulating shells around these components in accordance with certain embodiments. FIGS. 11B and 11C provide similar views of each individual component prior to arranging them into a subassembly. Specifically, FIG. 11B illustrates electrical component 1100b that includes a conductive element 1104b, a conductive strip 1106b, and a shaped portion 1102b, which provides both mechanical and electrical connections between conductive element 1104b and conductive strip 1106b. It should be noted that additional mechanical support may be provided by one or more insulating sheaths positioned over various portions of electrical component 1100b as further described below. FIG. 11C illustrates a similar electrical component 1100a that includes a conductive element 1104a, a conductive strip 1106a, and a shaped portion 1102a, which provides both mechanical and electrical connections between conductive element 1104a and conductive strip 1106a. Conductive element 1104a of electrical component 1100a may have a longer socket than conductive element 1104b of electrical component 1100b in order to ensure that the two socket's openings are aligned with respect to each other when two electrical component 1100a and 1100b are arranged into an assembly. As shown in FIG. 11A, when two electrical components 1100a and 1100b are arranged, there is no mechanical or electrical connections or contacts between electrical component 1100a and 1100b. It should be noted that electrical component 1100a and 1100b may be either integrated electrical components described above in the context of FIG. 9 or electrical components assembled from multiple individual components, some examples of which are described above in the context of FIG. 10.

Figure 11D:
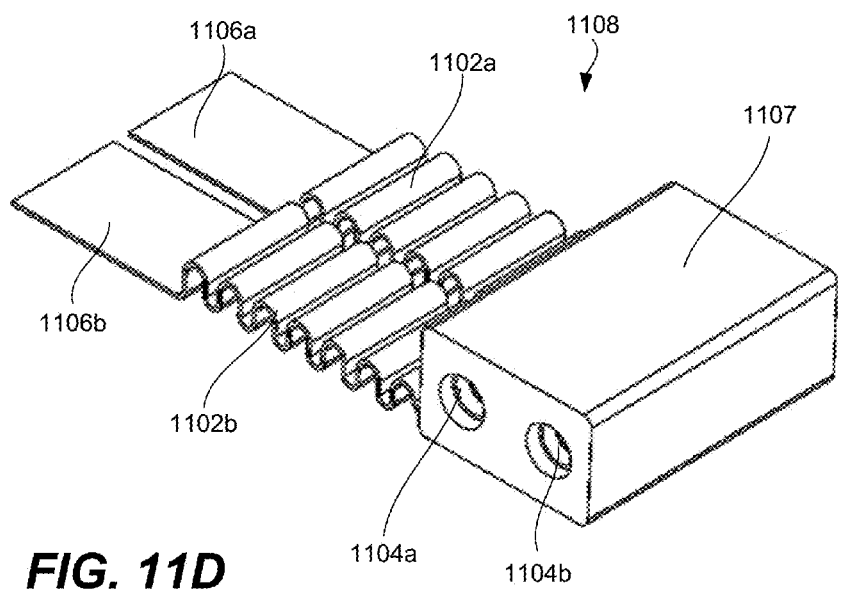
FIG. 11D is a schematic perspective view of a connector subassembly showing two electrical components partially enclosed by an insulating sheath in accordance with certain embodiments.

FIG. 11D is a schematic perspective view of a connector subassembly 1108 showing the two electrical components partially enclosed by an insulating sheath 1107 in accordance with certain embodiments. Insulating sheath 1107 may be only formed around conductive elements 1104a and 1104b and may not extend over shaped portions 1102a and 1102b. In these embodiments, insulating sheath 1107 may be formed from some rigid materials. Some examples of rigid materials and corresponding additives are described above. Insulating sheath 1107 may also be formed from flexible materials, examples of which are also described above. In certain embodiments, an insulative sheath that is formed around conductive elements 1104a and 1104b also extends over shaped portions 1102a and 1102b.

Figure 11E:
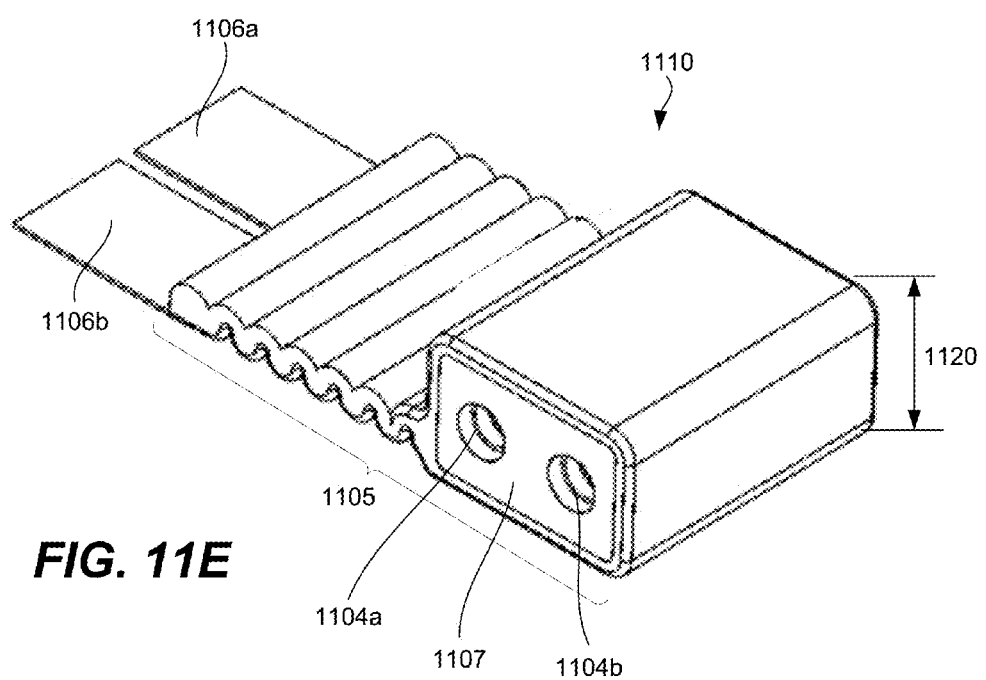
FIG. 11E is a schematic perspective view of a final connector assembly having two electrical components partially enclosed by two different insulating sheaths in accordance with certain embodiments.

FIG. 11E is a schematic perspective view of a final connector assembly 1110 having two electrical components partially enclosed by two separate insulating sheaths 1105 and 1107 in accordance with certain embodiments. Insulating sheath 1105 is shown formed over a portion of insulating sheaths 1107 leaving only a front face of insulating sheaths 1107 exposed. This front face has two openings allowing access to conductive elements 1104a and 1104b. Insulating sheath 1105 is also formed over the shaped portions, which are covered by a portion of the sheath and therefore are not visible in FIG. 11E. At least this portion of insulating sheath 1105 extending over the shaped portions is made from flexible materials, some examples of which are described above. A portion of sheath 1105 and sheath 1107 may be referred to a connector member, which is flexibly attached with respect to conductive strips 1106a and 1106b.

Figure 12:
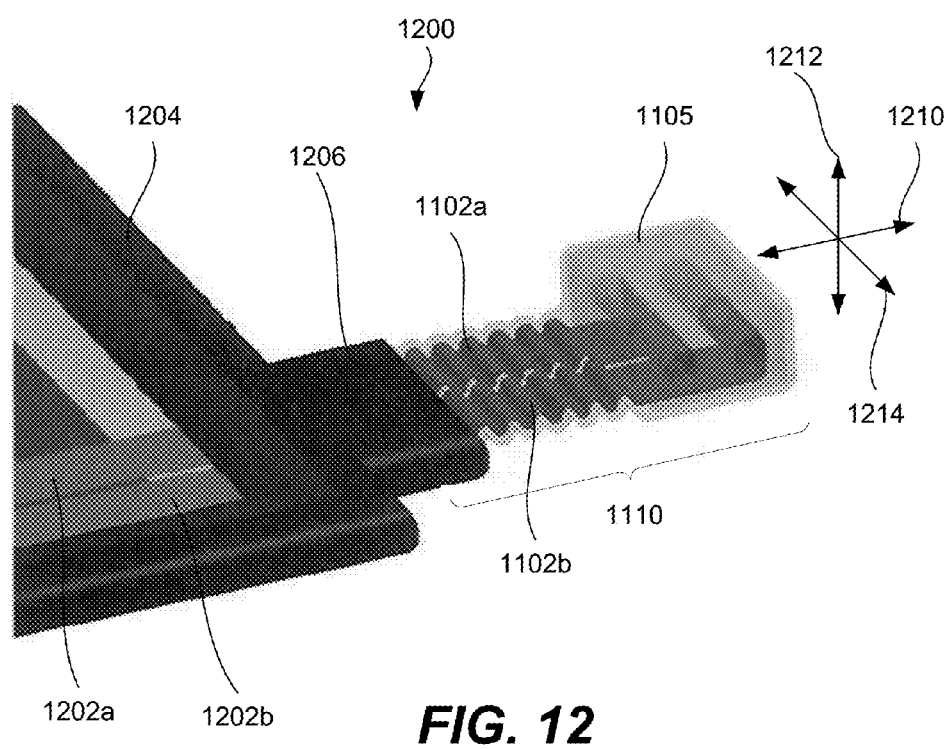
FIG. 12 is a schematic perspective view of a building integrable photovoltaic (BIP) module including a photovoltaic insert and a flexible connector in accordance with certain embodiments.

FIG. 12 is a schematic perspective view of a BIP module 1200 including a photovoltaic insert 1204 and flexible connector 1100 in accordance with certain embodiments. Connector 1100 has two conductive leads with corresponding shaped portions 1102a and 1102b. These leads are connected, respectively, to bus bars 1202a and 1202b of photovoltaic insert 1204 or extend into photovoltaic insert 1204 as bus bars 1202a and 1202b.

As described above, connector 1100 has a flexible portion that allows for connector member 1105 to move in one or more directions, such as directions 1210, 1212, and 1214, with respect to photovoltaic insert 1204. Connector member 1105 may need to be moved during installation or operation, e.g., for connecting to another connector, for accommodating any surface variations in roofing structures or possible slight movements of photovoltaic modules during operations, and other reasons. Connector member 1105 may move in one, two, or three directions with respect to photovoltaic insert 1204. These directions are identified with arrows 1210, 1212, and 1214 in FIG. 12. These axial movements may also correspond to various rotational movements. Direction 1210 extends parallel to conductive leads of connector 1100. Motions in this direction may be provided by simultaneous expansion or contraction of shaped portions 1102a and 1102b. Direction 1214 extends perpendicular to direction 1210 and may be substantially parallel to one edge of photovoltaic insert 1204. Motions in this direction may be provided by a combination of expansions and contractions of two shaped portions 1102a and 1102b. Finally, direction 1212 extends perpendicular to both directions 1210 and 1214 and may be substantially perpendicular to front and back sides of the module. Motions in this direction may be established by bending shaped portions 1102a and 1102b or other portions of the flexible member. In certain embodiment, a thickness 1120 of connector member 1105 is sufficiently small and allows connector member 1105 to fit into a ventilation channel of an adjacent BIP module.

Figure 13A:
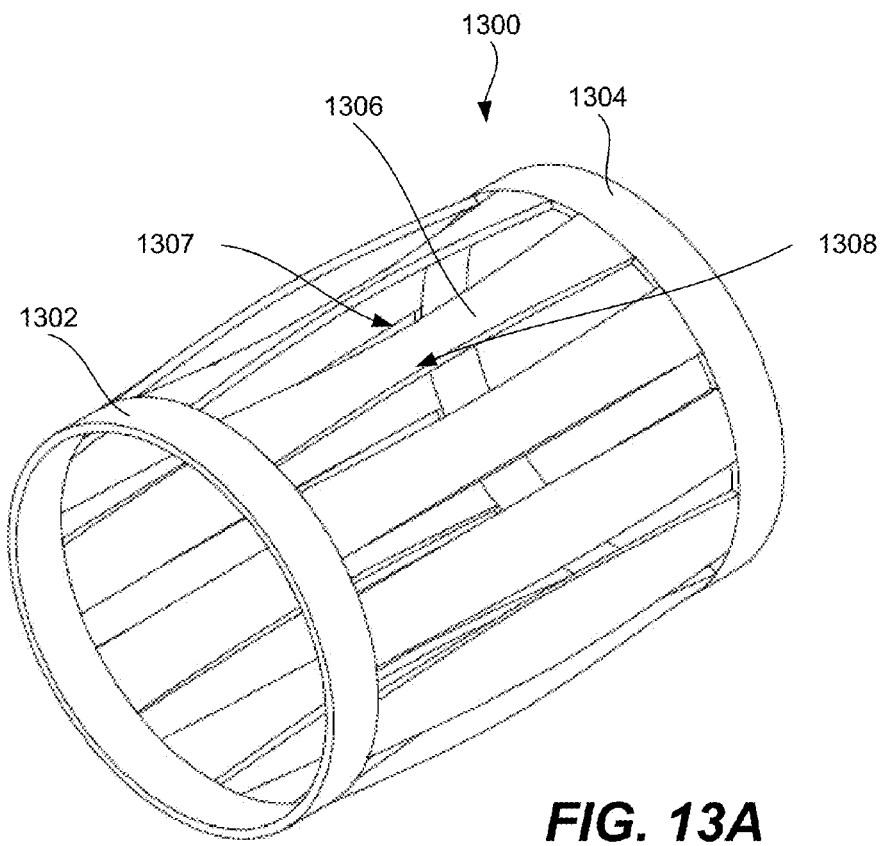
FIGS. 13A and 13B illustrate perspective and front views of a contact element having spring-type contact features in accordance with certain embodiments.
Figure 13B:
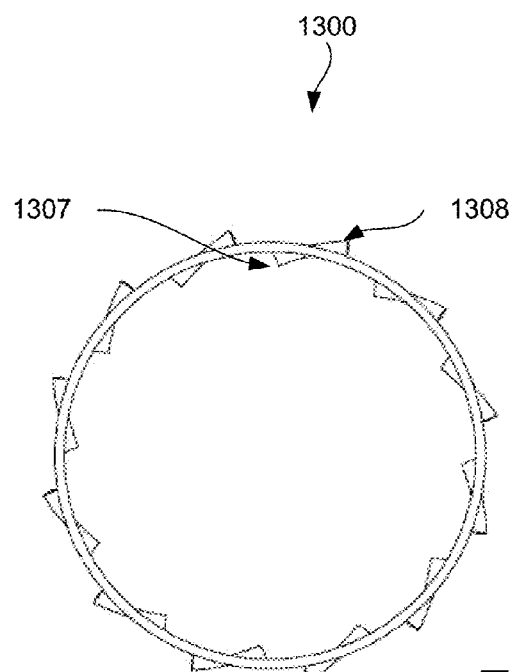

FIGS. 13A and 13B illustrates perspective and front views of a contact element 1300 having spring-type contact features in accordance with certain embodiments. This type of contact elements may be referred to as louvered contact elements. As shown in FIG. 13A, contact element 1300 has two rings 1302 and 1304. One of these rings 1302 and 1304 may be positioned near an opening of the connector member configured to receive a contact pin of another connector. Contact element 1300 also has multiple strips 1306 extending between the rings 1302 and 1304. Rings 1302 and strips 1306 may be made from one or more conductive materials, such as copper, aluminum, nickel, silicon, beryllium, tin, tellurium, silver, phosphorous, cobalt, iron, zinc, chromium, zirconium, magnesium, titanium, and combinations thereof. Strips 1306 are shown bent or, more specifically, twisted along their lengths to form edges 1307 and 1308. As shown in FIG. 13B, edges 1307 extend inward into the socket formed by contact element 1300, while edges 1308 extend outward. When a pin is inserted into such a socket cavity during installation, edges 1307 are pressed against the pin and cause substantial pressure and friction, which in turn may result in a lower contact resistance than contacts without such features. A contact element with spring-type features may be made as a separate component and then connected to a flat conductive strip (as described above in the context of FIG. 10) or formed as a part of the flat conductive strip (as described above in the context of FIG. 9).

Figure 13C:
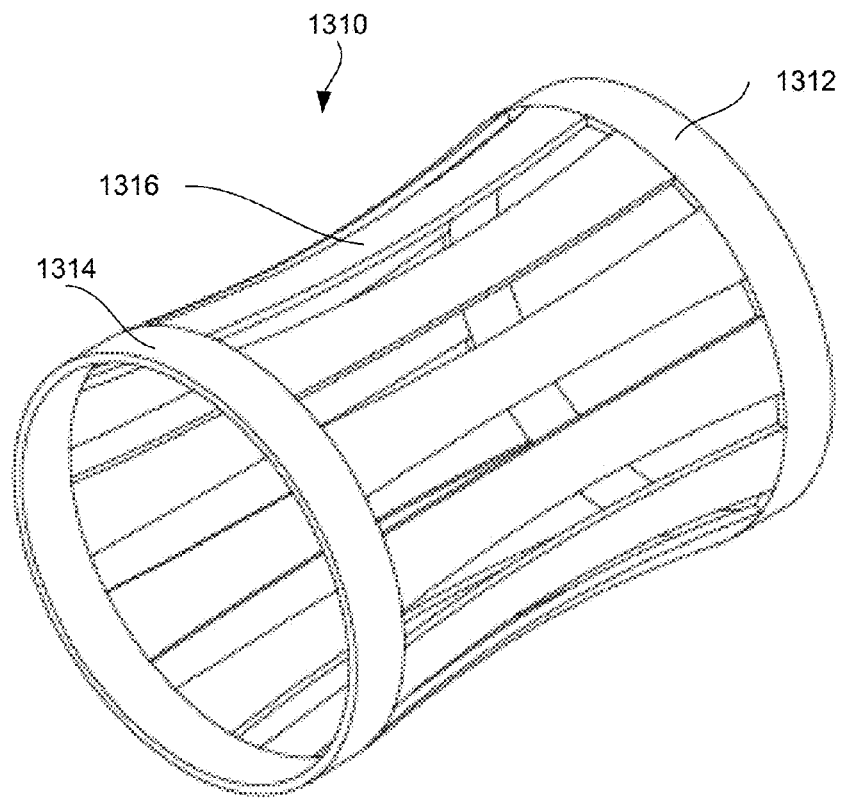
FIGS. 13C and 13D illustrate perspective and front views of another contact element having spring-type contact features in accordance with certain embodiments.
Figure 13D:
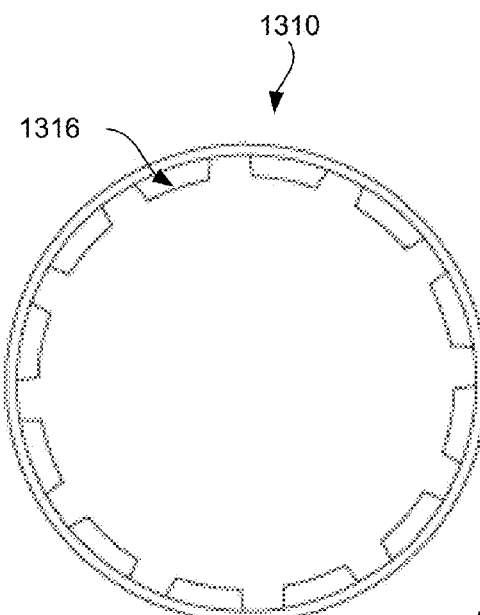

FIGS. 13C and 13D illustrate perspective and front views of another contact element 1310 having spring-type contact features in accordance with other embodiments. Contact element 1310 has curved strips 1316 extending between rings 1312 and 1314. Due to this curvature, middle portions of strips 1316 push on a pin during its insertion into a cavity to lower the contact resistance.

In certain embodiments, two contact elements of two separate BIP modules that need to be interconnected have socket designs similar to ones shown and described above in the context of FIGS. 9-13. Two sockets may be interconnected with a separate connector pin extending into both sockets. A pin may be a separately provided component, i.e., it may not be a part of either one of the connectors prior to installation. This overall design may significantly simplify fabrication process and make photovoltaic modules more versatile by eliminating multiple types of connectors (e.g., male and female as described in the context of FIGS. 8A-8C) needed on the same module. Connectors on both sides of modules may have socket designs and may be connected to other socket connectors of adjacent modules as well as other photovoltaic array components.

Although the foregoing invention has been described in some detail for purposes of clarity of understanding, it will be apparent that certain changes and modifications may be practiced within the scope of the appended claims. It should be noted that there are many alternative ways of implementing the processes, systems and apparatus of the present invention. Accordingly, the present embodiments are to be considered as illustrative and not restrictive, and the invention is not to be limited to the details given herein.

What is claimed is:

1. A building integrable photovoltaic module comprising:
    a photovoltaic insert comprising one or more electrically interconnected photovoltaic cells enclosed in one or more sealing sheets; and
    a connector comprising a flexible member and a connector member;
        the connector member having an insulating body enclosing a conductive element, wherein the conductive element is configured to establish an electrical connection to another conductive element of an adjacent building integrable photovoltaic module,
        the flexible member separating the insulating body from the photovoltaic insert and providing flexible mechanical support to the connector member with respect to the photovoltaic insert and providing an electrical connection between the conductive element and the one or more electrically interconnected photovoltaic cells, wherein
        the flexible member comprises a first flat conductive strip mechanically and electrically connected to the photovoltaic insert having a wave-shaped portion extending between the photovoltaic insert and the connector member, the wave-shaped portion having two or more peaks wherein the wave shaped portion extends outside the area of the photovoltaic insert.

2. The building integrable photovoltaic module of claim 1, wherein the first flat conductive strip has a width-to-thickness ratio of at least about 10.

3. The building integrable photovoltaic module of claim 1, wherein the shaped portion allows the connector member to move in a direction parallel to the width of the first flat conductive strip within at least a predetermined range.

4. The building integrable photovoltaic module of claim 1, wherein the connector member comprises a cavity having a conductive inner surface, the conductive element covering at least a portion of the inner surface of the cavity.

5. The building integrable photovoltaic module of claim 4, wherein the conductive element covering at least a portion of the inner surface of the cavity comprises one or more contact louvered features extending inwards into the cavity.

6. The building integrable photovoltaic module of claim 5, wherein the contact features extending inwards into the cavity comprises louvered contact features.

7. The building integrable photovoltaic module of claim 1, wherein the conductive element is formed from the first flat conductive strip.

8. The building integrable photovoltaic module of claim 1, wherein each of the one or more photovoltaic cells comprises a conductive support substrate and a conductive top surface current collector, and wherein the first flat conductive strip is attached directly to at least one of: a conductive support substrate and a current collector.

9. The building integrable photovoltaic module of claim 8, wherein the conductive support substrate comprises a stainless steel foil.

10. The building integrable photovoltaic module of claim 9, wherein the conductive top surface current collector comprises a wire network.

11. The building integrable photovoltaic module of claim 1, wherein the first flat conductive strip is attached to a bus wire.

12. The building integrable photovoltaic module of claim 1, wherein the first flat conductive strip is between about 3 and 18 millimeters wide and between about 0.1 and 0.6 millimeters thick.

13. The building integrable photovoltaic module of claim 1, wherein the first flat conductive strip is between about 6 and 12 millimeters wide and between about 0.2 and 0.4 millimeters thick.

14. The building integrable photovoltaic module of claim 1, wherein the first flat conductive strip comprises one or more of the following materials: copper, aluminum, nickel, silicon, beryllium, tin, tellurium, silver, phosphorous, cobalt, iron, zinc, chromium, zirconium, magnesium, titanium, and combinations thereof.

15. The building integrable photovoltaic module of claim 1, wherein at least the shaped portion is enclosed in and electrically insulated by a flexible polymeric shell.

16. The building integrable photovoltaic module of claim 15, wherein the flexible polymeric shell extends over and provides electrical insulation to the conductive element.

17. The building integrable photovoltaic module of claim 1, further comprising a second conductive element positioned in the connector member,
    the flexible member comprising a second flat conductive strip having a second shaped portion extending between the photovoltaic insert and the connector member and allowing the connector member to move in one or more directions with respect to the photovoltaic insert,
    wherein the second flat conductive strip is electrically insulated from the first flat conductive strip and provides an electrical connection between the second conductive elements and the one or more electrically interconnected photovoltaic cells or a bus bar passing through the photovoltaic insert.

18. The building integrable photovoltaic module of claim 17, wherein the second flat conductive strip extends parallel to the first flat conductive strip at least between the photovoltaic insert and the connector member and is positioned over or next to the first flat conductive strip.

19. The building integrable photovoltaic module of claim 1, wherein the insert has a long dimension and a short dimension and the first flat conductive strip extends from the photovoltaic insert in a direction substantially parallel to the short dimension.

20. The building integrable photovoltaic module of claim 1, wherein a portion of the flexible member is not movable with respect to the photovoltaic insert.

21. The building integrable photovoltaic module of claim 1, wherein at least a portion of the flexible member is external to the photovoltaic insert and the connector member.

\* \* \* \* \*